United States Patent [19]

Fan et al.

[11] 4,059,461
[45] Nov. 22, 1977

[54] METHOD FOR IMPROVING THE CRYSTALLINITY OF SEMICONDUCTOR FILMS BY LASER BEAM SCANNING AND THE PRODUCTS THEREOF

[75] Inventors: John C. C. Fan; Herbert J. Zeiger, both of Chestnut Hill, Mass.

[73] Assignee: Massachusetts Institute of Technology, Cambridge, Mass.

[21] Appl. No.: 639,540

[22] Filed: Dec. 10, 1975

[51] Int. Cl.$^2$ ............................................. H01L 21/26
[52] U.S. Cl. .................................... 148/1.5; 148/187; 427/53; 427/86
[58] Field of Search .................. 148/1.5, 187; 427/53, 427/86

[56] References Cited

U.S. PATENT DOCUMENTS

| | | | |
|---|---|---|---|
| 2,855,334 | 10/1958 | Lehovec | 148/1.5 |
| 3,458,368 | 7/1969 | Haberecht | 148/1.5 X |
| 3,584,183 | 6/1971 | Chiaretta et al. | 148/1.5 X |
| 3,585,088 | 6/1971 | Schwuttke et al. | 148/1.5 X |
| 3,698,947 | 10/1972 | Kemlage et al. | 148/1.5 X |
| 3,848,104 | 11/1974 | Locke | 148/1.5 X |

*Primary Examiner*—G. Ozaki
*Attorney, Agent, or Firm*—Arthur A. Smith, Jr.; Martin Santa; David E. Brook

[57] ABSTRACT

A method is disclosed for improving the crystallinity of semiconductor films by scanning the surface of such films with a shaped, focused laser beam. The laser is matched to the film so that the beam delivers sufficient energy thereto to heat the film above a temperature at which crystallization occurs along the scan track.

34 Claims, 10 Drawing Figures

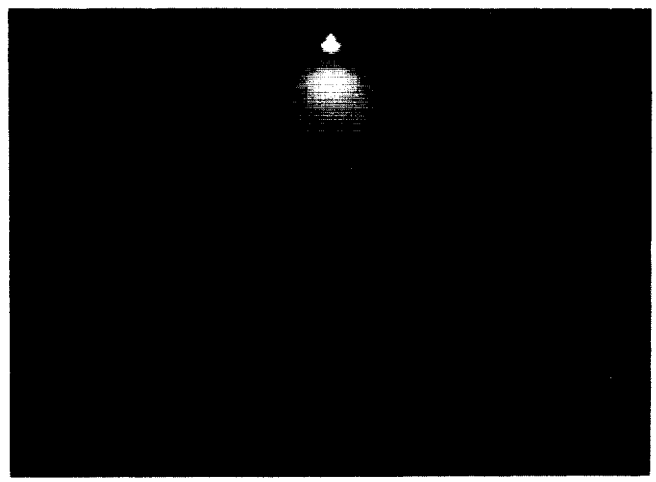
Fig. 3 - Amorphous Silicon Film
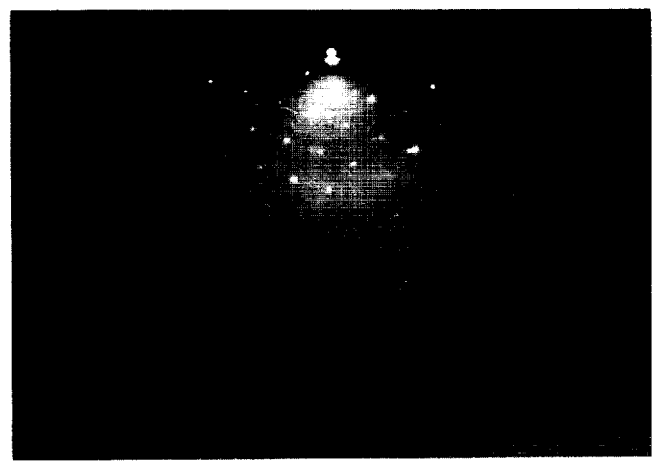
Fig. 4 - Crystalline Silicon Film Produced by Laser Scanning

METHOD FOR IMPROVING THE CRYSTALLINITY OF SEMICONDUCTOR FILMS BY LASER BEAM SCANNING AND THE PRODUCTS THEREOF

GOVERNMENT SUPPORT

This invention was made in the course of or under contracts or grants from the United States Air Force.

BACKGROUND OF THE INVENTION

1. Field of the Invention

This invention is in the field of semiconductor films which are useful in photovoltaic cells.

2. Description of the Prior Art

Photovoltaic cells have been developed for generating electrical energy directly from sunlight. Typically, these cells have been based on a semiconductor layer having an ohmic contact on one side and a rectifying contact, such as a p-n junction or a Schottky barrier, on the other side. Many semiconductors have been tested for this application and it has been found that silicon has desirable properties for use in photovoltaic cells.

Using silicon wafers, photovoltaic cells have been prepared with power efficiencies of up to about 18%. The cost of such cells, however, is very high, and such cells, in fact, have been considered to be prohibitively expensive. Because of this, silicon solar cells have only been used to any significant extent in applications where cost is not a controlling factor, such as on space vehicles or power sources in remote areas.

This high cost of photovoltaic cells is due in large measure to the requirement for crystal perfection which is necessary for high-efficiency operation and to the elaborate procedures involved in wafer preparation. Cell efficiency is lowered by a high density of crystallite grain boundaries which are present in polycrystalline silicon of small grain size. In order to eliminate as many grain boundaries as possible, the typical fabrication of silicon wafers for photovoltaic cells starts with the pulling of a high grade single crystal silicon boule which is then cut into wafers over 400$\mu$m thick. These are lapped, polished and mounted, after which a junction is formed by indiffusion of a dopant. The photovoltaic structure is then fabricated.

This procedure for the fabrication of solar cells is necessary to achieve the highest possible efficiency presently available. This is important in space applications, where efficiency is vital and cost is less important. For terrestrial applications, however, cost is the major factor, and some decrease in efficiency is acceptable if it permits a significant cut in cost.

One direction presently under study for the production of inexpensive silicon photovoltaic cells is the pulling of silicon ribbon in the EFG process. See, for example, Chalmers, B., LaBelle, Jr., H. E. and Mlavsky, A. I., *J. Cryst. Growth*, vol. 13/14, p. 84 (1972). This method bypasses the expensive cutting and polishing required in silicon wafer processing, and directly produces ribbon about 400$\mu$m thick. However, this scheme is not perfected, and is not yet capable of producing high quality material in a continuous process for long periods of time.

An alternative approach to the production of inexpensive photovoltaic cells is the use of thin film silicon deposited on a suitable backing. Such films having a thickness of about 10$\mu$m, for example, when suitably processed, are capable of producing electrical power with an efficiency potentially up to about 80% of that obtained with silicon single crystal wafer cells, or well over 10% efficiency. Such efficiencies are considered adequate for terrestrial applications provided that the cost of the cells is markedly reduced from that of conventional cells. Thin film silicon photovoltaic cells, with a thickness of about 10$\mu$m, compared to about 400$\mu$m for wafer photovoltaic cells, would allow considerable saving in material. Moreover, such films could be deposited in the final step of a process for the purification of silicon, thereby avoiding the cost of crystal pulling, and the cutting and polishing of wafers. However, the vital remaining step which must be taken before silicon films can be used in the fabrication of efficient photovoltaic cells is the treatment of the films to produce large grain crystalline material.

Attempts have been made to fabricate semiconductor films having large oriented crystallites for use in photovoltaic cells. Chemical vapor transport, vacuum deposition, high temperature thermal crystallization, and electron beam heating, for example, have all been tried. Most of these have inherent disadvantages or have shown only limited capability to produce the desired films. Vapor deposition and electron beam heating also require high vacuum conditions which add to the complexity and expense of film production.

Recently, attempts have been made to utilize lasers for the improvement of polycrystalline silicon films. It has been reported in the literature, for example, that a two-step processing technique employing transient laser heating and melting can be used to produce isolated regions of larger-grain polycrystalline silicon in films of fine-grain silicon on substrates such as silica. See Laff, R. A. and Hutchins, G. L., *IEEE Transactions on Electron Devices*, vol. ED-21, no. 11, Nov. 1974, p. 743. In the Laff et al. technique, a Gaussian-focused CW argon-ion laser beam of moderate power (1.5W) was swept along the surface of a 1$\mu$m thick film of fine grain CVD-deposited silicon at a velocity of about 10 cm/sec. This beam was modulated as it was swept so that only local regions along the track were illuminated. This caused localized heating of the film to about 1000° C for about $10^{-4}$ sec. which produced recrystallization and made heated areas selectively etch resistant as compared to surrounding fine grain areas. Repetitive stepwise deflection of the swept modulated beam was employed to obtain maskless fabrication of X-Y arrays of isolated silicon islands, resulting in crystallite grain sizes of about 1$\mu$m. A second and slower application of the laser beam applied to these isolated islands caused local melting with zone length L < 50$\mu$m and time of molten state $t \lesssim 10^{-3}$ sec., which resulted in crystallite grain sizes of up to about 5$\mu$m.

Despite some enlargement of silicon grain sizes, however, the Laff et al. procedures are not sufficient for large scale, inexpensive production of silicon films for photovoltaic cells. The argon-ion laser used, for example, is very inefficient having an overall power efficiency of only about 0.05%. Also, because of the high absorption coefficient of silicon at the frequency of an argon-ion laser, heating is limited to the surface layer which probably makes this laser unsuitable for preparing silicon films of sufficient thickness for solar cells.

Thus, despite the enormous amount of research directed at developing new production techniques for semiconductor films useful for photovoltaic devices, none of those developed heretofore have proven to be entirely satisfactory. There is still a great need for improved techniques.

SUMMARY OF THE INVENTION

This invention relates to the discovery that the crystallinity of semiconductor materials can be markedly improved by scanning the semiconductor with a focused laser beam from a high power laser which is suitably matched to the optical absorption properties of the particular semiconductor. For example, a focused beam from a Nd:YAG laser can be scanned across an amorphous silicon film at a rate sufficient to allow the film to heat to a temperature at which crystallization occurs. Use of a Nd:YAG laser is especially desirable with silicon films because of its relatively high overall power efficiency, its high power output, and because it is well matched to the absorption characteristics of an amorphous silicon film since radiation is absorbed substantially uniformly across a thickness of about 10μm. Large silicon crystallites are obtained after scanning, and it is even possible to use a shaped laser spot, such as a slit, to provide a preferred crystalline orientation within the film. Of course, other semiconductors and other lasers can be used, as long as the laser beam provides sufficient energy to the semiconductor to improve its crystalline properties.

This method offers significant advantages over those heretofore used for preparing crystalline semiconductor materials. For example, a large power density at reasonable efficiency is readily obtainable. Also, the laser beam can be focused to a variety of different shapes to achieve specific film properties, such as crystallite orientation which is not obtainable with alternative methods of producing crystalline films. Heating can be optimized by choosing a laser frequency matched to the semiconductor absorption coefficient. Unlike vapor deposition and electron beam heating techniques, laser scanning does not require vacuum, and, in fact, can be done in a controlled atmosphere to prevent oxidation, or in a doping atmosphere.

Since amorphous films tend to have narrower bandgaps than crystalline films, this method is particularly well suited to convert amorphous films to crystalline films. It is technically simpler and more economical, of course, to deposit amorphous semiconductor materials than their crystalline counterparts since much lower deposition temperatures are involved and the procedures are generally simpler.

BRIEF DESCRIPTION OF THE DRAWINGS

FIG. 3 is the reflection-electron diffraction pattern of an amorphous, 8μm thick film before laser scanning;

FIG. 4 is the reflection-electron diffraction pattern of an area of the same 8μm thick film after scanning;

DESCRIPTION OF PREFERRED EMBODIMENTS

Figure 1:
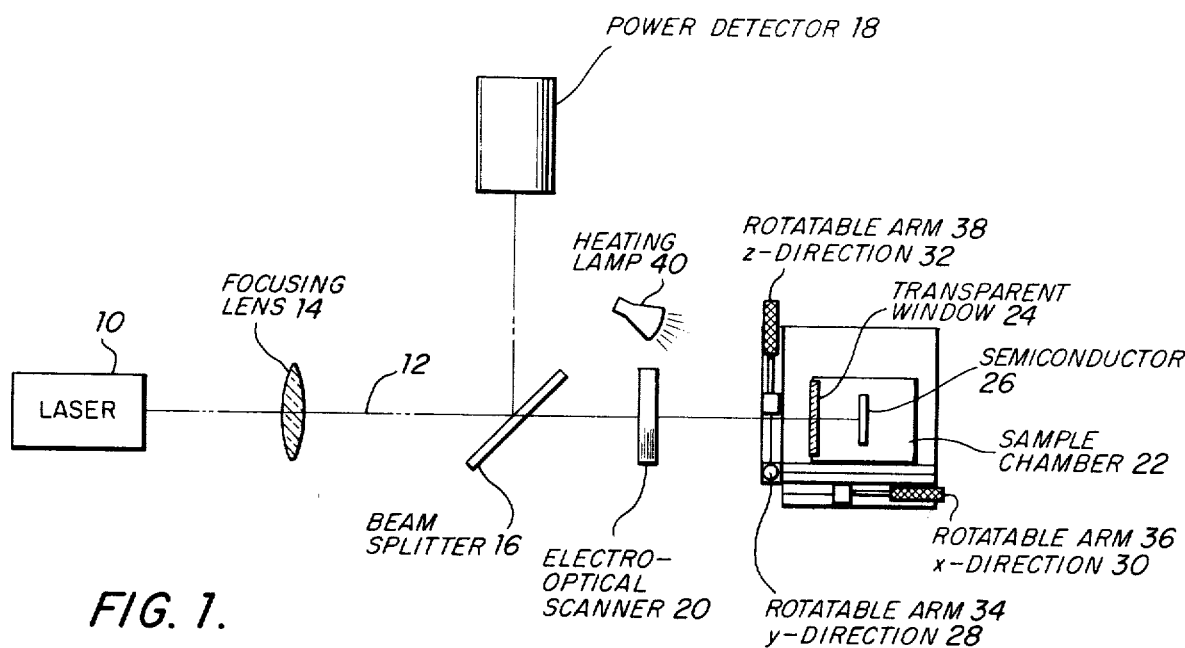
FIG. 1 is a perspective view of an apparatus suitable for scanning semiconductor films with a laser beam as described herein.

Referring now to the Figures in more detail, an apparatus suitable for scanning semiconductor films with a focused laser beam is illustrated in FIG. 1. Laser 10, which is a high power, high efficiency laser, such as a Nd:YAG laser, emits laser beam 12 which is focused to a spot having the shape and size desired by focusing lens 14. A preferred shape is an elongated slit because a slit can be used to orient semiconductor crystallites as well as to enlarge them. This is because the slit produces stresses in the semiconductor film transverse to its long axis. Because of these stresses, crystallization of the cooling film results in a preferred orientation, and growing, oriented domains then tend to coalesce as the scanning continues producing larger grains. The exact size and shape of the focused laser spot will depend upon factors such as laser power, scanning rate, area to be scanned, crystalline properties desired, etc. Various shapes are obtainable by employing beam expanders, cylindrical lenses, mirrors, or other optical or mechanical elements known to those skilled in the art. For reasons of practicality, it is preferred to use a spot size having an area of at least about $10^{-4}$ cm$^2$.

Beam splitter 16 is used to divide focused beam 12 so that a first portion is reflected to power detector 18 and a second portion is transmitted to electro-optical scanner 20. Power detector 18 serves to measure the exact beam power so that any desired changes in laser power, scanning rate, etc. can be made. Electro-optical scanner 20 is one convenient means for scanning focused beam 12. After passing scanner 20, focused beam 12 enters sample chamber 22 through transparent window 24 and strikes the surface of semiconductor 26, which can be silicon film or any other semiconductor material.

Scanning of semiconductor 26 can be achieved by mounting sample chamber 22 upon three translational stages, 28, 30 and 32. Translational stages 28, 30 and 32 provide the capability to move chamber 22, and thus semiconductor 26, in the x, y and z directions, respectively. Each stage can be independently driven by connecting rotatable arms 34, 36 and 38 to electric motors (not shown). Each stage can be driven separately, or any combination can be driven simultaneously. Also, the rate at which each stage can be driven is variable. Thus, a great variety of scan patterns and rates is achievable.

Other mechanisms can, of course, be used to achieve laser scanning. A suitable scanning system is described in U.S. Pat. No. 3,910,675 to MacGovern, for example. Other electro-optic or acousto-optical beam deflectors or other means to raster the laser beam can also be used, and these are known to those skilled in the art.

The scan rate is set, of course, by the dwell time required. This will vary with factors such as the specific semiconductor to be scanned, its thickness, the substrate it is supported upon, the laser power and efficiency, the spot size, the amount of additional heating provided by radiant or other heaters, heat losses from the film, etc. Those skilled in the art will be able to determine appropriate scan rates, taking such factors into consideration, by either calculation or routine experimentation. As an example, using a ten watt Nd:YAG laser with a spot focused to 100μm × 50μm with a dwell time of about $2 \times 10^{-5}$ sec., it has been estimated that a 10μm thick amorphous silicon film having an area of 1 meter square could be scanned to crystallize the silicon. In general, the dwell time must be sufficient to allow the area of the semiconductor film irradiated to reach the crystallization temperature.

Radiant heating lamp 40 is optional, and is used to help heat the semiconductor 26, particularly where laser power is marginal. Induction heaters or other means to heat semiconductor 26 could also be used.

Several silicon films, ranging in thickness from about 6 to 11 microns, were scanned using an apparatus as illustrated in FIG. 1, except that there was not an electro-optical scanner. These silicon films were all formed by RF sputtering silicon onto 25 mm diameter, single crystal aluminum oxide substrates. All films, as deposited, were found to be amorphous by both x-ray diffraction and reflection electron microscopy.

The films were mounted on a water-cooled copper block in a cylindrical Pyrex experimental chamber containing an 85% argon-15% hydrogen atmosphere. The copper mounting block had a 6 mm diameter hole so that measurements could be taken of laser power transmitted through the film.

A Nd:YAG laser, which was a multimode unit, pumped by a tungsten lamp, with maximum CW output of 7 watts was used. Six watts was actually used, and the beam was focused onto the silicon films by a 25 mm-focal-length quartz lens. Although the spot varied somewhat, depending upon focusing conditions, it was typically about 50μm wide and 100μm long. A copper block was inclined at 45° to the beam in order to allow monitoring of the film appearance and spot color as a function of laser power.

In order to prepare areas of improved crystallinity large enough for further characterization, the films were scanned laterally at the rate of about 1.2 cm/min. with successive overlapping scan lines centered 25μm apart. The scan rate was limited by the mechanical drive system available and not by sample heating requirements. Areas of about 0.5 × 0.25 cm were scanned.

Figure 2:
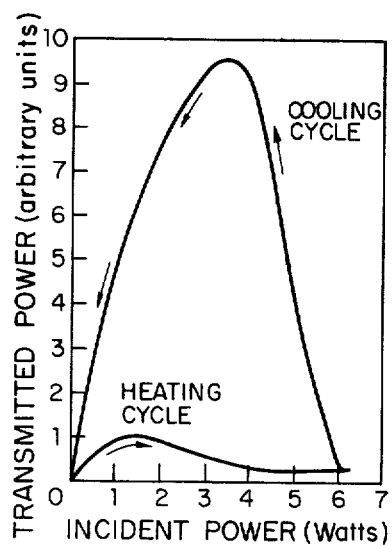
FIG. 2 is a plot of laser power transmitted through an 8μm thick, amorphous silicon film as a function of incident laser power.

FIG. 2 illustrates laser power transmitted through an 8μm thick, amorphous silicon film as a function of incident laser power. Incident power is expressed in watts whereas transmitted power is expressed in arbitrary units. As the incident power was first increased from zero, transmitted power increased until the incident power reached about 1.5 watts. At this point, the film appeared dull red in the region of the laser beam focus. Further increases in incident power actually decreased the amount of transmitted power. At about 6 watts of incident power, the spot at which the laser beam impinged appeared white-hot. The laser power was then decreased. For a given incident power, the transmitted power was much larger during the cooling half of the cycle than during the heating half. When the cycle was repeated, it was found that transmitted versus incident power curves for both the heating and cooling half-cycles were essentially the same as the curve for the cooling half of the first cycle. A complete heating and cooling cycle took approximately 10 minutes. The experiment was repeated many times at different spots on this film as well as on several other initially amorphous films, and similar results were always obtained.

These results indicate that irreversible structural changes occur in amorphous silicon films at high enough incident laser power. It is believed that the maxima in both the heating and cooling curves of FIG. 2 are due in part to the decrease in band gap with temperature, although additional, non-linear processes are also probably involved.

For comparison, a single crystal silicon wafer (p-type, $\rho \sim 14\Omega$-cm, 300μm thick) was used in place of the amorphous silicon films, and the heating-cooling cycle shown in FIG. 2 was repeated. This time, both the heating and cooling half-cycles were identical, although the transmitted power curve showed a nonlinear behavior at high incident laser power levels.

To examine the structure of the silicon films, reflection-electron diffraction pictures were taken in a JEM-120 electron microscope 80-keV electron energy. FIG. 3 is the diffraction pattern of an amorphous, 8μm thick film before laser heating, while FIG. 4 is the pattern obtained for a laser-heated area of the same film. The diffraction spots in the latter pattern show that this area is quite ordered. The faint rings in this pattern, which have been identified as being due to silicon diffraction, indicate the presence of a small amount of fine-grained material.

The electron-beam spot size at the sample is larger than 2μm. In the reflection-diffraction mode of operation, the electron beam is incident at a very small grazing angle (about 1°) with respect to the sample. Therefore, the exact area intercepted is now known, but is much greater than $(2\mu m)^2$. Linear motion of the microscope stage by about 25μm in the laser-heated area did not significantly alter the spot patterns, indicating crystalline sizes of at least 25μm. Similar results were obtained in other films.

X-ray diffraction patterns for silicon films that had been scanned with a focused beam from a Nd:YAG laser showed sharp silicon lines. For some of these films, the lines were so sharp that their width could be attributed to instrumental broadening alone. However, since the x-rays sampled a larger area, estimated to be about 1 mm × 5 mm, several silicon lines were always present. In addition to silicon lines, sharp x-ray lines of the α-quartz $SiO_2$ phase were also observed in many laser-crystallized samples, although Auger analysis indicated that the oxygen concentration in the amorphous films was no greater than 0.2%, which was the detection limit. This suggests that the $SiO_2$ phase had been formed at the substrate-film interface (x-ray attenuation length of silicon is about 70μm). This was confirmed using Auger spectroscopy together with Ar-ion sputtering to obtain a depth profile for a crystallized silicon film 11μm thick. No oxygen could be detected from the surface down to about 9.5μm (estimated by assuming the sputtering rate to be constant). Beginning at that point, oxygen was detected, but aluminum was not detected until a depth of about 11μm. Apparently, the temperature during laser heating became so high that the $Al_2O_3$ substrate interacted with the silicon to form crystallized $SiO_2$.

Although the process has been illustrated with amorphous silicon films, other semiconductor materials can be used. These include, but are not limited to, germanium, gallium arsenide, indium phosphide, cadmium sulfide, cadmium telluride, gallium phosphide, etc. The thickness of the semiconductor film will depend upon factors such as whether the material is an indirect bandgap material or a direct bandgap material. For indirect bandgap semiconductors, such as silicon, thicker films will be required such as about 10µm. For direct bandgap semiconductors, such as indium phosphide, gallium arsenide, cadmium sulfide and cadmium telluride, thinner films such as about 1-4µm are suitable. The relationship between absorption and wavelength for semiconductors is published in the literature. See, for example, Rappaport, P., *Revue de Physique Appliquee*, vol. 1, p. 154 (1966), the teachings of which are hereby incorporated by reference. Those skilled in the art will be able to determine appropriate thicknesses under a given set of conditions.

Many substrates, including conducting and non-conducting substrates, can be used. Some examples include, but are not limited to, fused silica, glass, quartz, graphite, metals, tin doped indium oxide, etc.

Lasers other than Nd:YAG lasers can be used, of course, and will be preferred when semiconductors other than silicon are to be irradiated. Lasers can be chosen by taking into consideration such factors as the thermal conductivity of the semiconductor film, the thickness of the semiconductor film, the substrate, the laser beam spot size and scan rate, etc. To make the process practical, the laser should have a power output of at least about three watts and an efficiency of at least about 1%. Preferably, the laser will have a power output of at least about 100 watts and an efficiency of at least about 5%. Lasers such as CO or $CO_2$ lasers are examples of other suitable lasers, and those skilled in the art will know or be able to ascertain using no more than routine experimentation, other suitable lasers, especially when the teachings set forth herein are followed.

It is important that the specific high power, high efficiency laser used be matched to the specific semiconductor material to be scanned so that the radiation will be absorbed over the thickness of the film being irradiated. In this matching process, parameters such as laser power, laser wavelength, laser efficiency, semiconductor thickness, and semiconductor absorption coefficient are considered. This selection process is specifically illustrated below with the help of FIGS. 5 and 6.

Figure 5:
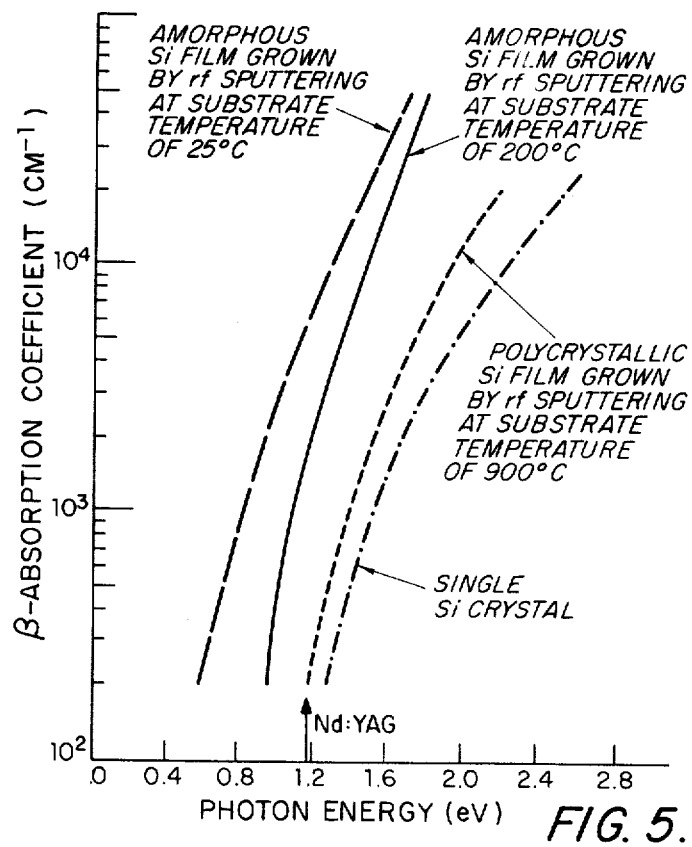
FIG. 5 is a plot of absorption coefficients at varying photon energies for a variety of silicon films.

FIG. 5 is a plot of absorption coefficient at varying photon energies for a variety of silicon films and this plot illustrates the advantage of using a Nd:YAG laser to scan and crystallize amorphous silicon films. As previously indicated, a reasonable thickness for silicon films suitable for use in photovoltaic cells is about 10µm, and the energy absorption should preferably be distributed throughout the 10µm thickness as opposed to being concentrated at the surface. Absorption varies with thickness according to the differential equation, $$(dI/dt) \alpha - \beta t,$$

wherein $I$ = laser intensity, $t$ = film thickness, $\beta$ = absorption coefficient of the film. Upon solving this equation, the relationship is $I \propto e^{-\beta t}$. If it is desired to have the film absorb power across its entire thickness, the product of the absorption coefficient ($\beta$) and the film thickness ($t$) should be in the range of about 1-3; therefore, $\beta$ should be about $1-3 \times 10^3 \text{cm}^{-1}$ for a 10µm thick film.

The Nd:YAG laser has a photon energy of 1.17 electron volts which is indicated on FIG. 5. As can be seen, a single crystal silicon film has an absorption coefficient ($\beta$) of less than $10^2 \text{cm}^{-1}$ at 1.17 electron volts, which means that this absorption coefficient is too small. Irradiation of a 10µm single crystal silicon film would result in very little absorption of laser power from a Nd:YAG laser. A polycrystalline silicon film produced by RF sputtering at a substrate temperature of 900° C also has an absorption coefficient ($\beta$) of less than $10^{-2}$cm which is also too low. An amorphous silicon film deposited by RF sputtering at a substrate temperature of 200°, on the other hand, has an absorption coefficient ($\beta$) at a photon energy of 1.17 electron volts of about $2 \times 10^3 \text{cm}^{-1}$, which is well within the desired range. Similarly, an amorphous silicon film grown at 25° C has an absorption coefficient ($\beta$) of about $5 \times 10^3 \text{cm}^{-1}$, which is still close to the desired range. If the absorption coefficient ($\beta$) becomes too large, as for example, around $10^5 \text{cm}^{-1}$, the product of $\beta t$ would be about 100, which means that most absorption would occur only at the surface of the film, again a situation to be avoided.

Figure 6:
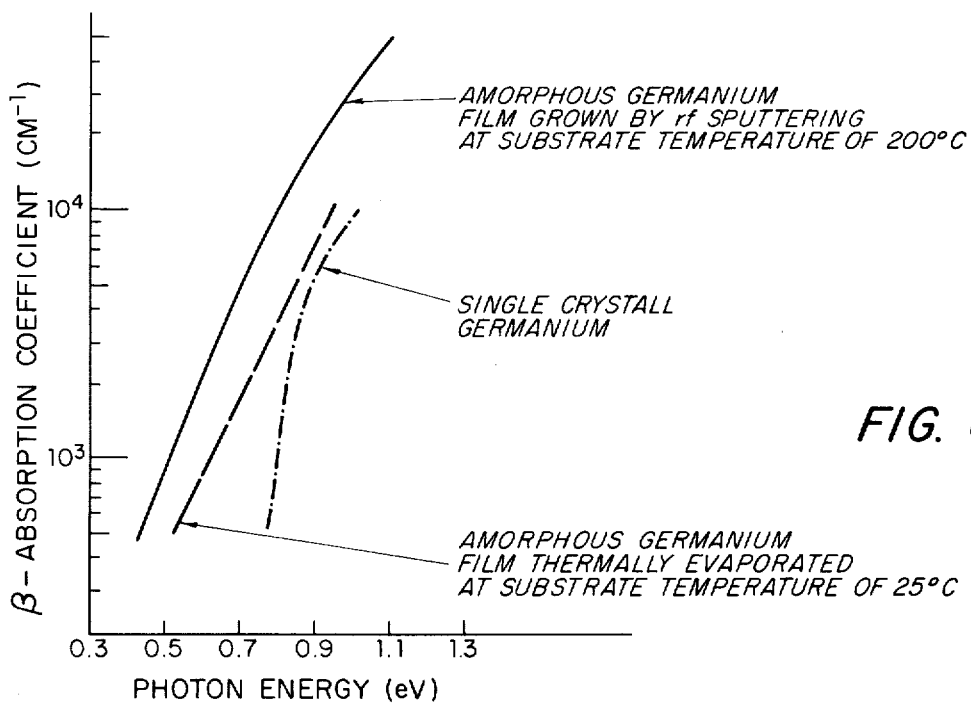
FIG. 6 is a plot of absorption coefficients at varying photon energies for a variety of germanium films.

FIG. 6 is a plot of absorption coefficients at varying photon energies for a variety of germanium films and illustrates the selection and matching process for such films. From FIG. 6, it can be seen that it would be desirable to irradiate amorphous germanium films with a laser having a photon energy of about 0.7 electron volts. A single crystal germanium film would have an absorption coefficient ($\beta$) of less than $10^2 \text{cm}^{-1}$, and would not absorb sufficient laser energy. An amorphous germanium film grown by RF sputtering at a substrate temperature of around 200° C, however, would have an absorption coefficient of about $5 \times 10^3 \text{cm}^{-1}$, which is within the desired range for this film. For a thermally evaporated film at a substrate temperature of 25° C, the absorption coefficient ($\beta$) is about $2 \times 10^3 \text{cm}^{-1}$, which is also within the desired range.

Those skilled in the art, following the specific teachings contained herein, will recognize other combinations of lasers and semiconductor films which can be used to practice this invention. They will also be able to ascertain many additional combinations by no more than routine experimentation.

Figure 7:
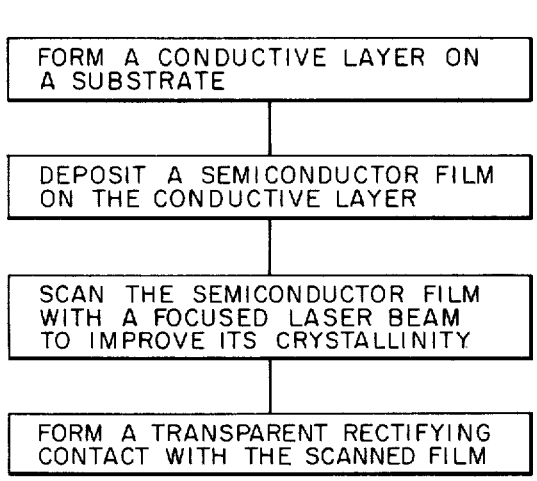
FIG. 7 is a block diagram which illustrates one method for fabricating a photovoltaic cell employing laser beam scanning of a semiconductor film as described herein.

FIG. 7 illustrates diagrammatically the fabrication of a photovoltaic cell employing the laser scanning procedures described above and FIG. 8 illustrates the cell itself. The first step in this fabrication is the formation of a conductive layer 52 on a substrate 50. This could be achieved, for example, by vacuum depositing a metal layer such as copper, silver, tin, gold or other metal onto substrate 50. Substrate 50 need not be transparent, but certainly could be. Also, substrate 50 itself could be conducting, which satisfies the first step in this fabrication.

Then, a film of amorphous or polycrystalline semiconductor 54 is deposited onto conducting layer 52 or directly onto substrate 50 if it is conducting. An example is the deposition of a thin film of silicon during the final step in the preparation of pure silicon by a method such as the chlorosilane process. Thus, the cost of the amorphous silicon film could be covered in the silicon purification step. Any suitable semiconductor deposition process which provided the purity required could be used, of course, since the usual crystalline perfection requirements are not present because the semiconductor film will undergo laser beam scanning.

Amorphous or polycrystalline semiconductor film 54 is then scanned with a focused laser beam from a high power laser to improve its crystalline properties. This might be achieved, for example, in the case of an amorphous silicon film by a mechanical linear sweep of the silicon sheet under a slit image from a Nd:YAG laser while the slit image is scanned laterally back and forth by an acousto-optic or electro-optic scanner.

Finally, a transparent rectifying contact 56 is formed with laser-scanned semiconductor film 54. This could be done, for example, by depositing a transparent, highly conducting tin doped indium oxide film over a thin transparent metallic layer to form a Schottky barrier. Suitable tin-doped indium oxide films are described in Fan, J. C. C. and Bachner, F. J., *J. Electrochem. Soc.*, 122, 1719 (1975), the teachings of which are hereby incorporated by reference. Alternatively, a rectifying contact could be formed by laser scanning in a doping atmosphere to form a p-n junction at the surface of the laser-scanned film.

Figure 8:
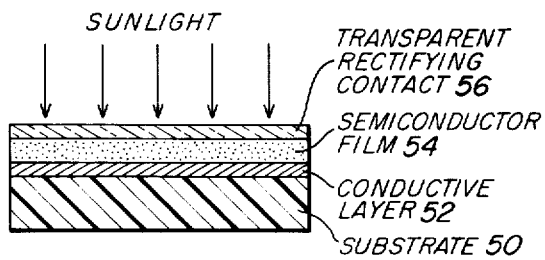
FIG. 8 is a cross-sectional view of a photovoltaic cell which could be prepared by the method illustrated in FIG. 7.

As is illustrated in FIG. 8, sunlight enters the photovoltaic cell through the transparent, rectifying contact 56 and passes to the laser scanned semiconductor film 54 where a photovoltaic current is generated.

Figure 9:
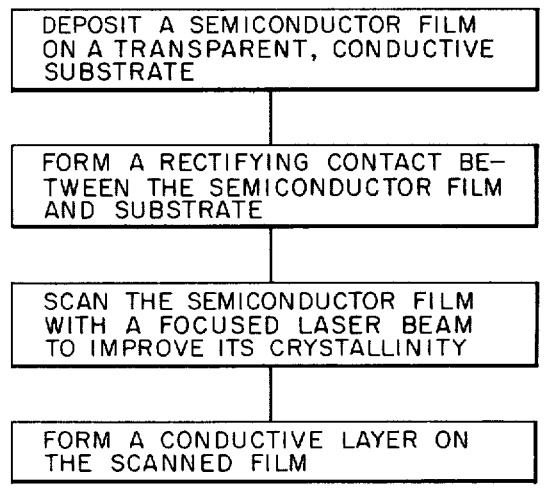
FIG. 9 is a block diagram which illustrates an alternative method for fabricating a photovoltaic cell employing laser beam scanning of a semiconductor film as described herein; and, FIG. 10 is a cross-sectional view of a photovoltaic cell which could be prepared by the method illustrated in FIG. 9.
Figure 10:
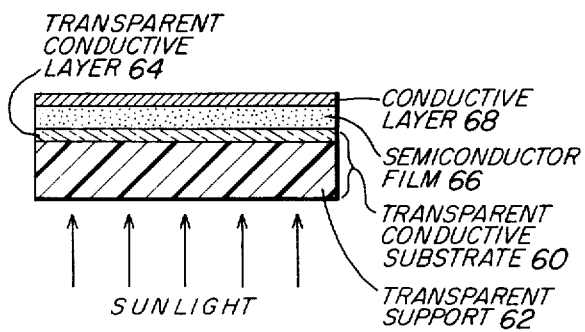

FIG. 9 illustrates diagrammatically an alternative procedure for fabricating a photovoltaic cell employing the laser scanning procedures described herein and FIG. 10 illustrates the cell itself. In this fabrication procedure, a transparent, conductive substrate 60 is used which can be formed by depositing on transparent support 62 a conductive layer 64. Transparent support 62 can be glass or transparent plastic and conductive layer 64 can be a thin layer of a conductive metal. Preferably, conductive layer 64 is a material which will also form a rectifying contact with the semiconductor layer subsequently deposited thereon. A layer of tin-doped indium oxide, as previously mentioned, would serve as a conductor and would also form a Schottky barrier with some semiconductors such as silicon. Alternatively, another layer which is capable of forming a rectifying contact with the semiconductor could be deposited onto conductive layer 64. Of course, one material which is transparent, conductive, and capable of forming a rectifying contact with the semiconductor layer could also be used. Also, the rectifying contact required can be formed upon deposition of the semiconductor film, or alternatively, in a post treatment of the film. In fact, one suitable post treatment is the laser scanning of the semiconductor film.

A semiconductor film 66, such as a thin film of amorphous silicon, is then deposited on top of transparent, conductive substrate 60. As noted previously, many of the known processes for depositing semiconductor films can be used since the usual limitations on crystal perfection are obviated with subsequent laser scanning of the film.

The semiconductor film 66 is then scanned with a focused laser beam from a high power laser to improve the film's crystalline properties. Lastly, a conductive layer 68, such as aluminum or other metal, is formed on top of laser-scanned semiconductor film 66. As can be seen in FIG. 10, sunlight enters this photovoltaic cell through the transparent, conductive substrate 60.

There are many equivalents to the embodiments specifically described herein which fall within the scope of this invention. Such equivalents are intended to be covered by the following claims.

What is claimed is:

1. A method for improving the crystallinity of a semiconductor film by scanning it with a focused beam from a continuous wave laser having a wavelength at which the semiconductor film has an absorption coefficient sufficient to allow laser radiation to be absorbed over the semiconductor film thickness.

2. A method of claim 1 wherein said semiconductor film is a silicon film.

3. A method of claim 1 wherein said laser is a high power, high efficiency laser.

4. A method of claim 3 wherein said high power, high efficiency laser has a power output of at least about 3 watts and an efficiency of at least about 1%.

5. A method of claim 4 wherein said laser beam is focused to a shaped spot.

6. A method of claim 5 wherein said shaped spot has an area of at least about $10^{-4}$ cm$^2$.

7. A method of claim 6 wherein said semiconductor film is a polycrystalline semiconductor film.

8. A method of claim 6 wherein said semiconductor film is an amorphous film.

9. A method of claim 6 wherein said semiconductor film is a germanium film.

10. A method of claim 6 wherein said semiconductor film is a silicon film.

11. A method of claim 10 wherein said silicon film is an amorphous silicon film.

12. A method of claim 11 wherein said high power, high efficiency laser is a Nd:YAG laser.

13. A method of claim 12 wherein said laser beam is focused and shaped to a slit image.

14. A method of claim 6 wherein said laser beam is focused and shaped to a slit image.

15. A film produced by the method of claim 1.

16. A method for producing a crystalline silicon film from an amorphous silicon film by scanning said amorphous film with a focused laser beam produced by a continuous wave Nd:YAG laser at a rate sufficient to produce crystallization within said amorphous film.

17. A method of claim 16 wherein said amorphous silicon film is about 10μm thick.

18. A method of claim 16 wherein said amorphous silicon film is supported on a substrate.

19. A film produced by the method of claim 16.

20. A method for fabricating a photovoltaic cell, comprising:
   a. forming a conductive layer on a substrate;
   b. depositing a semiconductor film on said conductive layer;
   c. scanning the semiconductor film with a focused beam from a laser to improve the crystallinity of said semiconductor film; and,
   d. forming a transparent rectifying contact with the scanned film.

21. A method of claim 20 wherein said laser is a high power, high efficiency laser.

22. A method of claim 21 wherein said rectifying contact is a Schottky barrier.

23. A method of claim 21 wherein said rectifying contact is a p-n junction.

24. A method of claim 21 wherein said semiconductor film which is deposited is silicon.

25. A method of claim 24 wherein said silicon film is an amorphous silicon film.

26. A method for fabricating a photovoltaic cell, comprising:
   a. depositing a semiconductor film on a transparent, conductive substrate;
   b. forming a rectifying contact between the semiconductor film and substrate;

c. scanning the semiconductor film with a focused beam from a laser to improve the crystallinity of said semiconductor film; and, d. forming a conductive layer on the scanned film.

27. A method of claim 26 wherein said laser is a high power, high efficiency laser.

28. A method of claim 27 wherein said rectifying contact is a Schottky barrier.

29. A method of claim 27 wherein said semiconductor film which is deposited is silicon.

30. A method of claim 29 wherein said silicon film is an amorphous silicon film.

31. A method for producing a crystalline semiconductor film, comprising:

a. depositing an amorphous film of a semiconductor on a substrate; and, b. scanning said amorphous film to crystallize it with a laser beam having a wavelength which is significantly absorbed across the thickness of said amorphous film and significantly transmitted by the crystallized semiconductor film.

32. A method of claim 31 wherein said laser is a continuous wave Nd:YAG laser.

33. A method of claim 32 wherein said amorphous film is an amorphous silicon film.

34. A method of claim 31 wherein said amorphous film is an amorphous germanium film.

* * * * *